United States Patent [19]

Fay et al.

[11] Patent Number: 5,100,829
[45] Date of Patent: Mar. 31, 1992

[54] PROCESS FOR FORMING A SEMICONDUCTOR STRUCTURE WITH CLOSELY COUPLED SUBSTRATE TEMPERATURE SENSE ELEMENT

[75] Inventors: Gary V. Fay, Scottsdale; Stephen P. Robb, Tempe; Judith L. Sutor, Chandler; Lewis E. Terry, Phoenix, all of Ariz.

[73] Assignee: Motorola, Inc., Schaumburg, Ill.

[21] Appl. No.: 648,072

[22] Filed: Mar. 1, 1991

Related U.S. Application Data

[62] Division of Ser. No. 397,052, Aug. 22, 1989, Pat. No. 5,025,298.

[51] Int. Cl.⁵ ............................................. H01L 21/70
[52] U.S. Cl. .................................. 437/60; 437/7; 437/15; 437/51; 357/28; 374/178
[58] Field of Search .................. 357/28; 437/7, 15, 51, 437/60, 904; 374/178

[56] References Cited

U.S. PATENT DOCUMENTS 4,760,434 7/1988 Tsuzuki et al. ................ 357/28
4,896,192 1/1990 Blanchard et al. ............. 357/28
4,903,106 2/1990 Fukunaga et al. ............. 357/28

FOREIGN PATENT DOCUMENTS 0299264 12/1988 Japan .

Primary Examiner—Brian E. Hearn
Assistant Examiner—Trung Dang
Attorney, Agent, or Firm—Joe E. Barbee; Stuart T. Langley

[57] ABSTRACT

MOSFET devices or circuits incorporating an improved substrate temperature sensing element are obtained by forming a PN junction directly on a thin (gate) dielectric region. The temperature sense junction is desirably formed in a poly layer. By mounting it directly on thin (gate) dielectric its thermal response to temperature changes in the substrate is improved while still being electrically isolated from the substrate. It is desirable to provide over-voltage protection elements coupled to the junction to avoid rupture of the underlying thin dielectric. Because the sense diode and all the over-voltage protection devices may be made of poly with junctions perpendicular to the substrate, the structure is particularly compact and simple to fabricate.

10 Claims, 3 Drawing Sheets

PROCESS FOR FORMING A SEMICONDUCTOR STRUCTURE WITH CLOSELY COUPLED SUBSTRATE TEMPERATURE SENSE ELEMENT

This is a division of application Ser. No. 07/397,052, filed Aug. 22, 1989, now U.S. Pat. No. 5,025,298.

FIELD OF THE INVENTION

The present invention concerns means and methods for electronic devices and, more particularly, means and methods for semiconductor devices incorporating a substrate temperature sensing element.

BACKGROUND OF THE INVENTION

It is known in the electronics art, particularly the semiconductor art, to incorporate substrate temperature sensing elements to detect increases or decreases in substrate temperature for purposes of protecting the device or circuit from failure from uncontrolled temperature increase.

PN junctions make convenient temperature sensing elements for semiconductor devices. The current through a forward biased PN junction depends on the applied voltage, junction area and junction temperature and, when properly calibrated, can be used as a measure of junction temperature. If the sensing current is small and the thermal conductivity of the substrate material adequate, the temperature at the sensing junction is a reasonable measure of the adjacent substrate temperature. Where monolithic (built into the substrate) PN junctions are used, this is a reasonable approximation in most situations.

However, a difficulty encountered in using substrate PN junctions is that they are electrically connected to the substrate. This makes them difficult to use from a circuit point of view. It is hard to provide multiple PN junctions in series or parallel and, unless elaborate construction or circuit techniques are employed, it is difficult or impossible to electrically isolate them from the device or circuit, on the same substrate, that they are intended to protect.

A partial solution to this problem has been proposed by Y. Tsuzuki et al. (hereafter Tsuzuki), in an article entitled "Self-Thermal Protecting Power MOSFET's", Proceedings of the Power Electronics Specialist's Conference, June 1987, pages 31-37. Tsuzuki utilizes a string of series connected diodes formed in a polysilicon layer on the field oxide of a power MOSFET to prevent the power MOSFET from overheating. Because the polysilicon temperature sensing diodes are electrically isolated from the substrate they can be arranged in a voltage divider circuit controlling the state of a bi-stable latch formed on the same chip. When the temperature of the sensing diodes increases in response to increases in the substrate temperature, the forward voltage drop across the sensing diode string decreases below the toggle point of the latch. When the latch switches, the gate of the power MOSFET coupled thereto is brought to a voltage sufficient to turn the device off so that thermal damage is precluded.

While the arrangement of Tsuzuki overcomes some of the problems in the prior art, it continues to suffer from a number of disadvantages. For example, there is a substantial thermal impedance between Tsuzuki's temperature sensing diodes and the semiconductor substrate the didoes are intended to protect. This is because Tsuzuki's diodes are thermally separated from the substrate by the field oxide. Field oxide (e.g., $SiO_2$) is approximately one hundred times less thermally conductive than Tsuzuki's silicon substrate. Other things being equal, poly diodes of the type utilized by Tsuzuki will be slower to respond to changes in substrate temperature and will not as accurately track substrate temperature as is desired. Thus, a need continues to exist for improved temperature sensing arrangements that are electrically isolated from but better thermally coupled to the semiconductor substrate they are intended to protect.

BRIEF SUMMARY OF THE INVENTION

It is an object of the present invention to provide improved means and methods for temperature sensing on semiconductor substrates. It is a further object of the present invention to provide an improved means and method for temperature sensing on substrates containing elements desired to be protected from over-temperature conditions by use of the output of the sensors. It is a still further objective to provide such improvements for sensors that are electrically isolated but better thermally coupled to the substrate.

Improved temperature sensors for protecting semiconductor substrates from over-temperature conditions are provided by a structure comprising, a semiconductor substrate, a dielectric located on the substrate and comprising multiple thinner regions, such as are used for example for gates on power MOSFETS, and a thicker region, such as is used for example for the field dielectric between semiconductor devices, and a semiconductor layer having a PN junction located on at least one thinner region for sensing substrate temperature through the thinner region of the dielectric. The semiconductor layer is desirably a polylayer and, in a preferred embodiment, comprises multiple parallel PN junctions or series-parallel junctions. The multiple parallel PN junctions are desirably separable by fusible links made of poly.

Where one or more leads from the PN junction extend to an external terminal of the device it is desirable to provide an electrical over-voltage protection means coupled between the temperature sensing junction and the substrate or reference terminal to prevent rupture of the thin dielectric under the junction. The over-voltage protection means desirably includes an anti-parallel diode coupled across the PN junction and at least two back-to-back diodes coupled from one end of the anti-parallel diode to the substrate.

The forgoing structure which permits, among other things, combining active MOSFETS with a substrate temperature sensing element is provided by a process comprising, providing a semiconductor substrate, forming on the substrate a dielectric having a first region of a first thickness and a second region of a second, larger thickness, wherein the first thickness corresponds to the thickness of gate dielectric of the active MOSFETS formed, for example, elsewhere on the substrate and the second thickness corresponds to the thickness of field dielectric separating, for example, the active MOSFETS, and forming on the first region a semiconductor PN junction in, for example, a polycrystalline semiconductor layer, electrically isolated from but thermally coupled to the substrate through the first region. The PN junction is conveniently obtained by oppositely doping adjacent regions of the semiconductor layer over the thin dielectric. Over-voltage protection devices are conveniently provided by forming other poly diodes in the same semiconductor layer at nearby locations, including at least two back-to-back PN junctions in a semiconductor layer over the field dielectric. The resulting junctions are conveniently substantially at right angles to the semiconductor layer.

The above and other objects and advantages of the present invention will be more fully understood by considering the accompanying figures and explanation that follows.

DETAILED DESCRIPTION OF THE FIGURES

Figure 1:
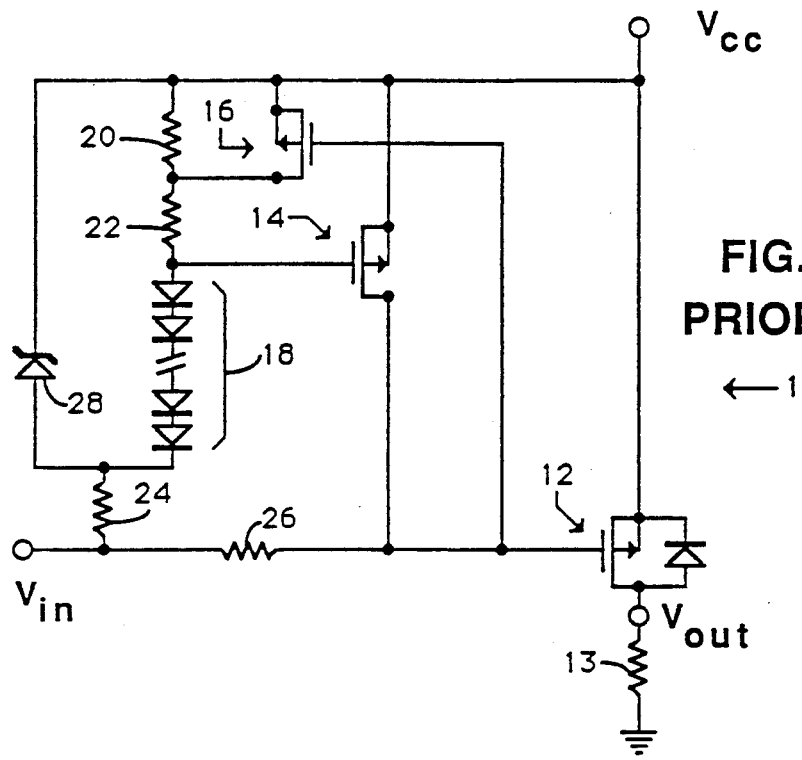
FIG. 1 is a circuit diagram of an implementation of a temperature compensated power MOSFET, according to the prior art.

FIG. 1 shows circuit 10, according to Tsuzuki, for providing automatic over-temperature protection of a P-channel power MOSFET. Circuit 10 has power MOSFET 12 coupled between Vcc and load 13. Transistors 14, 16, temperature sensing diode stack 18, resistors 20, 22, 24, 26 and Zener diode 28 form a bistable latch responsive to the forward resistance of temperature sensing diode stack 18. When the temperature of diode stack 18 increases, its forward drop decreases. By adjusting the size of the resistors and the Zener voltage as compared to the threshold voltage of transistors 14, 16, when the desired upper temperature limit is reached, the latch toggles and transistor 14 turns on, thereby swinging the gate of transistor 12 below threshold so that transistor 12 shuts off. Power transistor 12 will remain off until diode stack 18 has cooled sufficiently to permit the latch to toggle back to its initial state. Those of skill in the art will understand without further explanation how circuit 10 operates.

Figure 2:
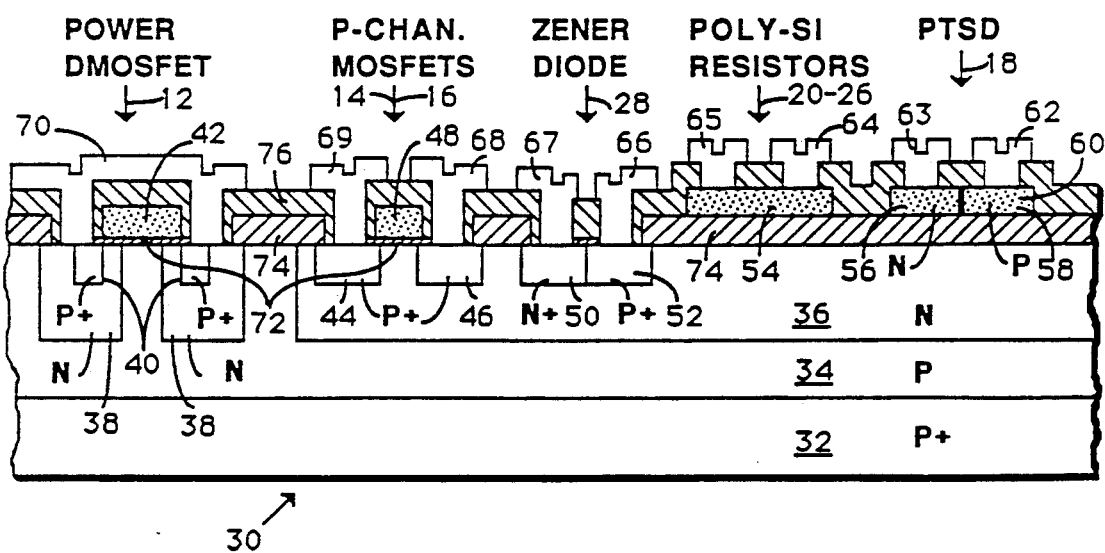
FIG. 2 is a schematic cross-section of a portion of a semiconductor chip, according to the prior art, showing how the devices of the circuit of FIG. 1 are implemented.

FIG. 2 is a simplified schematic cross-section, according to Tsuzuki, showing how the various elements of circuit 10 are implemented in portion 30 of a silicon substrate. Portion 30 comprises P+ substrate 32 surmounted by P region 34 in which are formed N-tubs 36, 38. N-tubs 38 contain P+ regions 40 that form the source of P-channel DMOS power transistor 12, while regions 32, 34 form the drain. Polysilicon region 42 forms the gate of power DMOS transistor 12.

P+ regions 44, 46 formed in N-tub 36 provide the source and drain of, for example, transistor 14 with poly gate region 48. Transistor 16 is formed in a like manner. Intersecting N+ region 50 and P+ region 52 in tub 36 form Zener diode 28. Poly region 54 show how any one of resistors 20-26 is formed. The other resistors are formed in a like manner.

Temperature sensing diode stack 18 is formed by providing a multiplicity of adjacent interconnected N and P poly regions. An example of one such region comprising doped regions 56, 58 in poly region 60 is shown in FIG. 2. By series connecting a multiplicity of such structures a stack of diodes is formed. Since all the diodes in stack 18 face in the same electrical direction, they are combined using metal connections 62, 63. Metal connections 64-70 are similarly provided for contacting the other circuit elements.

It will be observed in FIG. 2, that thin gate dielectric, (e.g., $SiO_2$) is used under poly gates 42, 48 while remaining poly portions 54, 56, 58 rest on much thicker field dielectric (e.g., $SiO_2$) 74. Additional dielectric layer 76 is provided over the poly gates, field oxide and parts of other poly regions 54-58 to facilitate separation of adjacent metal regions 62-70.

Most of the power dissipation in MOSFETS occurs in the drain field region. In a DMOS or TMOS type MOSFET, the drain field region is located within the substrate and it is the substrate temperature near the power device that must be accurately and rapidly tracked by the temperature sensing device if it is to offer optimal output for protection purposes. A limitation of the structure of FIG. 2 is that poly temperature sensing diodes (PTSD) 18 rest on field oxide 74. The thermal impedance of field oxide 74 separates PTSD's 18 from the underlying semiconductor substrate in which power device 12 is formed. It has been found that the thermal impedance of field oxide 74 is significant compared to the thermal impedance of the substrate material. As a consequence, the sensitivity and response time of PTSD's located on the field oxide are inhibited thereby. These and other problems associated with prior art temperature sensors for use in connection with power devices and circuits are avoided or mitigated by the present invention described in connection with FIGS. 3-7.

Figure 3:
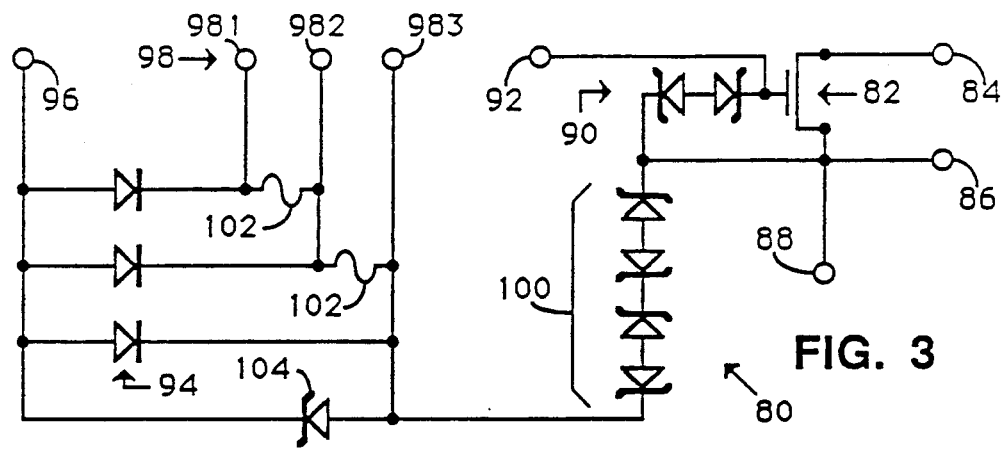
FIG. 3 is a circuit diagram of a temperature sensing element combined with over-voltage protection devices, according to the present invention.

FIG. 3 is an electrical schematic of circuit 80 in which temperature sensing diodes are combined with other devices for improved performance, according to the present invention. Circuit 80 comprises power device 82 having terminals 84, 86 for connection between an energy source and a load (not shown). One terminal, e.g., 88 serves as the reference terminal for device 82 and its associated elements. Back-to-back diodes 90 are conveniently provided between gate input terminal 92 of transistor 82 and reference terminal 88 to absorb over-voltage conditions on gate lead 92. This prevents, among other things, electrostatic discharge (ESD) damage to the gate oxide of device 82.

Polysilicon temperature sensing diodes (PTSD) 94 are provided between terminals 96, 98 and connected through back-to-back diode stack 100 to reference terminal 88 of power device 82. PTSD units 94 are constructed on the same substrate as power device 82 in close proximity thereto so as to be able to follow the temperature of power device 82 as rapidly and accurately as possible. Fusible links 102 are conveniently provided between terminals 96, 98 so that one or more portions of PTSD units 94 may be retained or removed from the circuit so that the desired impedance level is selectable.

Voltage reference diode 104 is conveniently provided across PTSD units 94 and also has one end coupled to reference terminal 88 through diode stack 100. Diode stack 100 has at least two and preferably at least four back-to-back diodes. Diode stack 100 provides over-voltage protection for diodes 94 to prevent their shorting to the substrate. Diode stack 100 is desirable because the manner of construction of PTSD units 94 makes them more susceptible to over-voltage damage.

Figure 4:
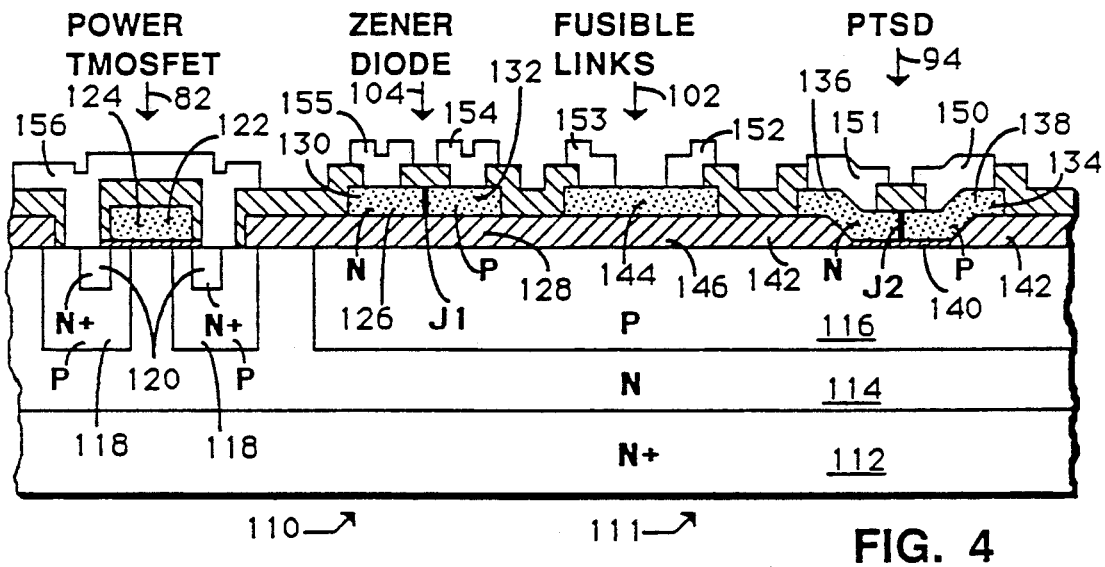
FIG. 4 is a schematic cross-section of a portion of a semiconductor chip, analogous to FIG. 2 but according to the present invention, showing how the devices of the circuit of FIG. 3 are implemented.
Figure 5:
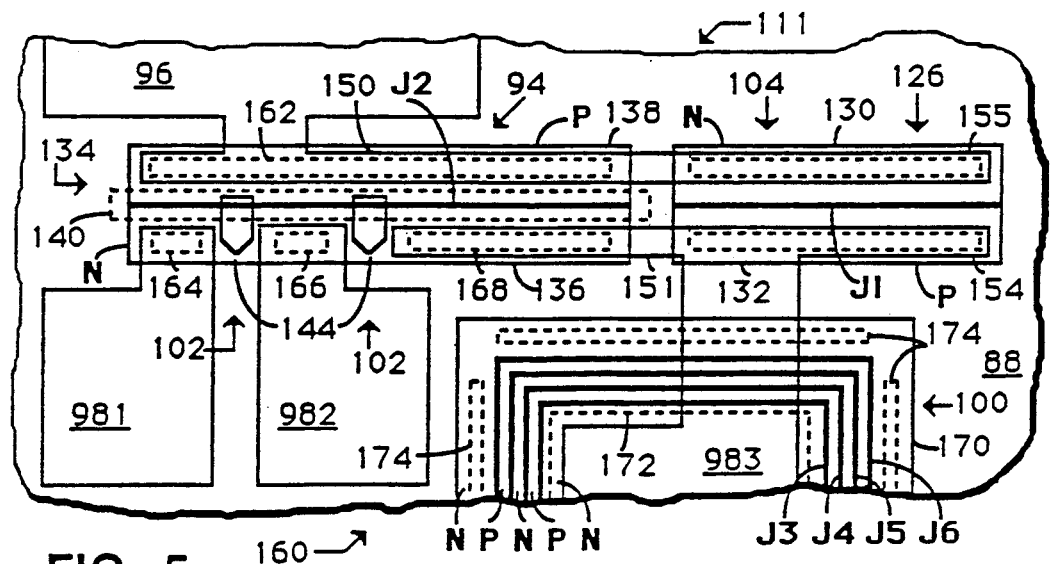
FIG. 5 is a simplified plan view of the arrangement of the present invention, according to a preferred embodiment thereof.

The manner of construction of the devices of circuit 80 will be more fully appreciated by reference to FIGS. 4 and 5 in which the various elements of FIGS. 3 are illustrated. FIG. 4 is a simplified schematic cross-section analogous to that of FIG. 2 and shows the vertical cross-sections of various elements employed in FIG. 3. For simplicity, the cross-sections of duplicate elements and the details of how the various elements are interconnected to form the circuit of FIG. 3 are omitted from FIG. 4. FIG. 4 is not intended to be a literal cross-section through a particular part of device portion 110 further illustrated in plan view in FIG. 5.

Referring to FIG. 4, portion 110 comprises substrate 111 having N+ region 112 and superposed N layer 114 with P-tubs 116, 118. N+ source regions 120 are formed in tubs 118 to provide TMOS power transistor 82. N-type region 114 and N+ region 112 function as the drain and drain contact region. Polysilicon gate 122 is provided over thin gate dielectric 124 of power device 82.

Zener diode 104 is provided in poly region 126 on field dielectric 128. Poly region 126 comprises N region 130 and P region 132 which meet to form junction J1. PTSD unit 94 is formed in poly region 134 comprising N region 136 and P region 138 that meet to form junction J2. It is essential that junction J2 is located on thin (gate) dielectric region 140 rather than on adjacent field dielectric region 142. This is necessary to insure that the thermal impedance between PTSD units 94 and substrate 111 are minimized while still preserving electrical isolation therefrom. It is important that PTSD units 94 be electrically isolated from but in the best possible thermal contact with substrate 111. This permits the greatest circuit flexibility in using the electrical response of PTSD units 94 while maintaining the best thermal correspondence between the temperature of PTSD units 94 and power device 82.

Fusible links 102 are conveniently provided by poly region 144 on field dielectric region 146. It is desirable to minimize thermal coupling between fusible links 102 and substrate 111 so that fusible links 102 may be blown without damaging substrate 111. Thus, the thermal requirements of fusible links 102 are opposite to the thermal requirements of PTSD units 94. Nevertheless, there is a need to incorporate them in monolithic form on the same semiconductor substrate. This is accomplished by placing the PTSD units on thin (gate) oxide or other comparably thin dielectric and placing the fusible links on thick field oxide or other thick dielectric.

Metal regions 150–156 are conveniently provided for making contact to PTSD units 94, fusible links 102, Zener diode 104 and power device 82. Means and methods for forming such metal contacts are well known in the art.

While only one PTSD unit and one fusible link and one Zener diode and power transistor are shown in the cross-section of FIG. 4, those of skill in the art will appreciate based on the description herein that many such units may be arranged in parallel or series or combinations thereof.

FIG. 5 illustrates in a simplified way a plan view of portion 160 of a semiconductor device having PTSD units 94, diode stack 100, fusible links 102 and Zener diode 104 interconnected in the fashion shown in circuit 80. Portion 160 is surrounded by multiple cells (not shown) making up power TMOS device 82 so that PTSD units 94 are in close proximity to power device 82 laterally as well as vertically. The details of the multiple parallel cells used to make up a power TMOS or power DMOS device are not shown since they are well understood in the art. In general, those parts of portion 160 outside the regions particularly illustrated are covered with metallization for reference (e.g., source) contact 88. Corresponding regions of FIG. 5 have been identified with the same reference numbers as used in FIGS. 3 and 4.

Referring now to FIGS. 3–5 together, poly region 134 (in the left center of FIG. 5) comprises N region 136 and P region 138. P region 138 has thereover, pre-ohmic region 162 through which metallization 150 makes contact with region 138 and extends to external contact pad 96, shown partially in the upper left of FIG. 5. N region 136 incorporates fusible link poly regions 144, which have pre-ohmic contacts 164, 166, and 168 which provide connection to metal contacts 98$_1$, 98$_2$ and 98$_3$ respectively. Contact 98$_3$ has a portion corresponding to metal region 151 contacting N-type poly region 136 in FIGS. 4–5. Contact 98$_3$ also has a portion corresponding to metal region 154 contacting P region 132 of Zener diode 104 in FIGS. 4–5. This provides the connections indicated in circuit 80 to Zener 104, fusible links 102 and PTSD units 94.

The construction of diode stack 100 is illustrated in FIG. 5 but has been omitted from FIG. 4 for simplicity since, as far as its cross-section is concerned, it is formed in generally the same manner as Zener diode 104. Poly region 170 is provided underneath metal pad 98$_3$ in FIG. 5. Adjacent portions of poly region 170 are doped alternately N and P to form back-to-back junctions J3–J6, as shown in the bottom center to right of FIG. 5. The center-most N-type portion under pad 98$_3$ connects to pad 98$_3$ via pre-ohmic 172. The outer-most N-type portion of poly region 170 is coupled to source contact metallization 88, indicated only generally in FIG. 5, at pre-ohmics 174.

Thin (gate) dielectric region 140 is illustrated in FIG. 5 as extending centrally from left to right under junction J2 in poly region 140. The thin oxide may also extend under junction J1. This insures that PTSD units 94 and, optionally Zener unit 104, are in excellent thermal contact with substrate 111 but electrically isolated therefrom, except by appropriate metallization tying them to the reference terminal through diode stack 100. Thin dielectric regions, such as are used for example for gate oxides in MOSFETS, are generally of the order of one-tenth the thickness of the field dielectric used elsewhere on the semiconductor die outside the active regions. Thus, other things being equal, the thermal impedance between the temperature sense diodes of the present invention and the substrate power device is reduced by approximately this same factor as compared to the prior art. This is a significant improvement.

EXAMPLE

Semiconductor devices implementing the present invention were constructed in silicon substrates. N+ wafers were coated with N-type epi using means well known in the art. P-tubs 2–3 micrometers deep and N+ regions 0.4-0.8 micrometers deep were formed in the epi-layers using means well known in the art.

Thin dielectric regions were formed from $SiO_2$ having a thickness in the range of about 0.03-0.08 micrometers, with about 0.04-0.06 micrometers being typical. While the above-noted range of thickness for the thin dielectric is satisfactory, the PTSD elements of the present invention may be placed on any dielectric thickness of about 0.1 micrometer or less and on any dielectric otherwise suitable for use on the semiconductor substrate. $SiO_2$ with a thickness in the range of about 0.4-0.8 micrometers with about 0.6 micrometers being typical was used for the field dielectric. The greater the ratio of field to gate dielectric thickness, the greater the improvement in thermal performance achieved by the present invention. While $SiO_2$ is convenient for the dielectric, other dielectrics may also be used, such as for example but not limited to, silicon nitride and/or silicon oxide-silicon nitride mixtures. Other things being equal, the higher the thermal conductivity of the dielectric, the better the thermal performance of the PTSD elements.

The temperature sensing diodes were formed on a poly region measuring approximately 0.05×0.34 mm with a substantially centrally located thin oxide region measuring approximately 6 micrometers in width and about 0.34 mm long. The temperature sensing junction (J2) was located approximately along the center line of the thin oxide region. Pre-ohmics were about 7 micrometers wide, and of a length commensurate with the underlying material being contacted. The poly fusible links were about 0.01-0.02 mm in length by about 0.004-0.007 mm in width. The poly region used for Zener 104 had dimensions of about 0.05×0.25 mm.

The polysilicon layer used for the temperature sensing and Zener junctions, the fusible links and the overvoltage protection devices was deposited on the dielectric to a thickness in the range of about 0.4-0.8 micrometers, typically into the polylayer to produce a sheet resistance of about $2-10 \times 10^3$ ohms/square P-type. The regions desired to be N-type were then counter-doped to provide a sheet resistance of about 25 ohms/square N-type. Al-Si was used for metallization. The foregoing was accomplished using conventional processing steps individually well known in the art.

The fusible links were located at respectively, approximately 70-90%, typically about 80%, of and 30-50%, typically about 40%, of the length of junction J2 along PTSD poly region 134. Thus, the area of J2 (poly thickness×PTSD poly length) and hence the current-voltage characteristics could be correspondingly adjusted after device fabrication by blowing one or both of the fusible links. This is very convenient for adjusting the sensitivity to the desired values. Other values are obtained by providing series-parallel combinations of multiple PTSD elements on the same substrate.

Figure 6:
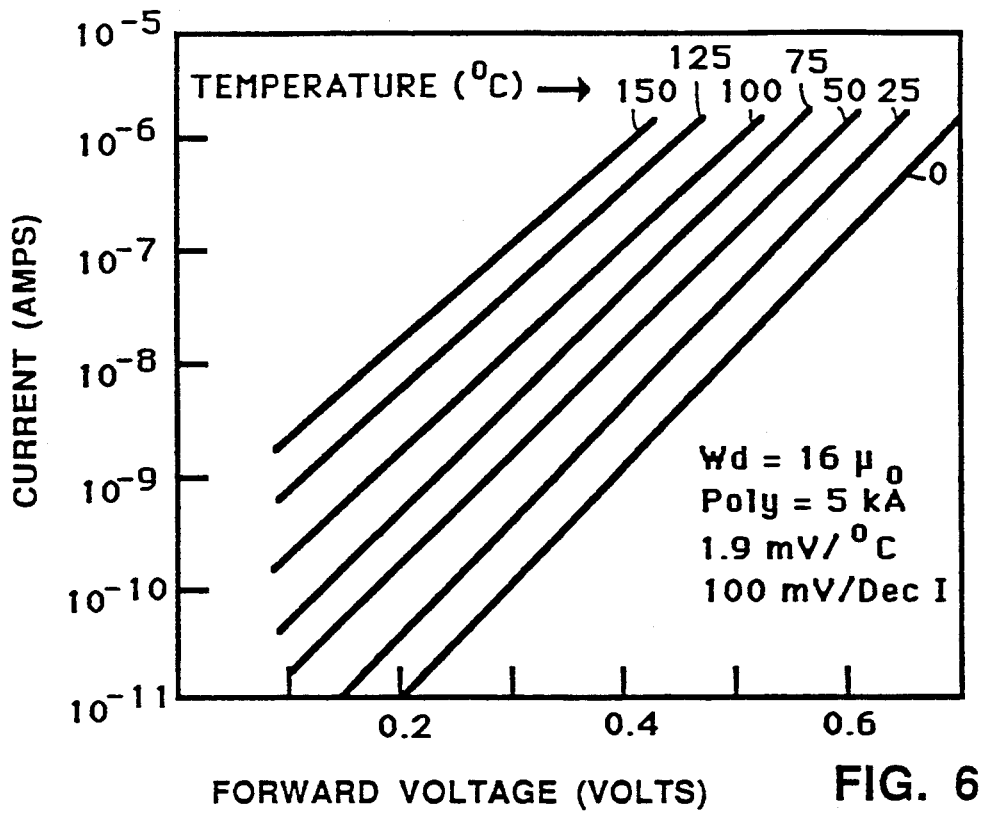
FIG. 6 is a plot of the current voltage characteristics of the temperature sensing diodes of the present invention at various temperatures.

Devices as described above were fabricated and tested, individually and also approximately surrounded by multiple source regions of a large conventional TMOS device. FIG. 6 shows the current-voltage characteristics of thin oxide PTSD devices fabricated according to the present invention. The temperature sensitivity of the poly junctions formed according to the present invention is good.

Figure 7:
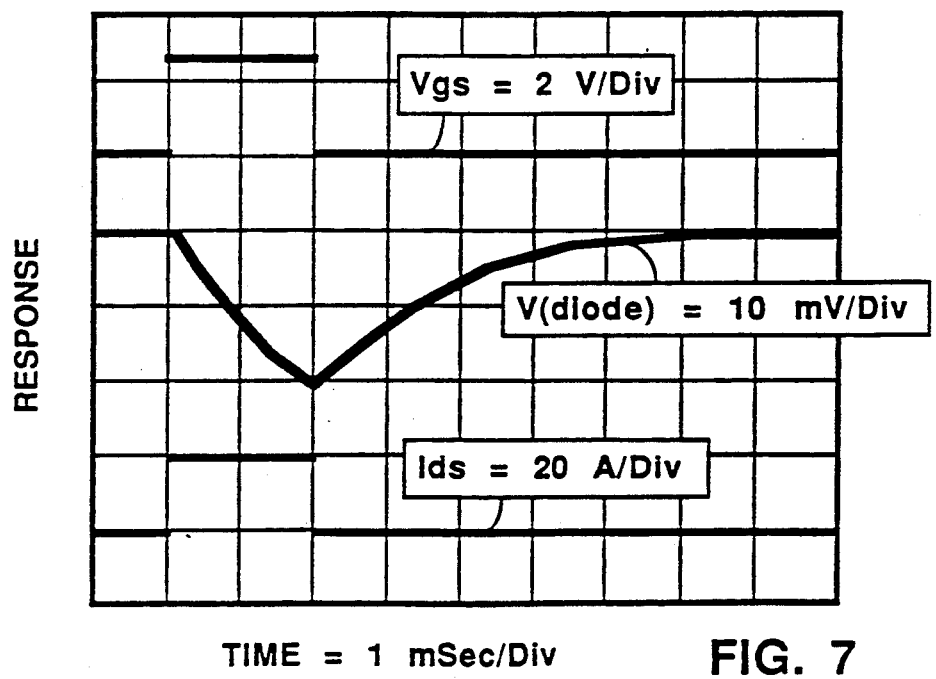
FIG. 7 shows the transient response of the temperature sensing diodes of the present invention when an associated power MOSFET is pulsed on and off.

FIG. 7 shows the transient response of such thin oxide PTSD devices when the associated power device was pulsed on and off. It is apparent from the PTSD diode trace reproduced in FIG. 7 that there is very little delay between the onset of conduction in the power device, and hence the onset of substantial power dissipation therein, and the temperature rise detected by the poly diode located on the thin gate oxide. Other tests in which the sweep speed of the oscilloscope was increased indicated that the response time of the thin oxide PTSD element was substantially less than 100 microsecond, typically of the order of 10 microseconds.

In other tests, the above described thin oxide PTSD devices were constructed within large TMOS devices having nominal maximum current ratings of 50-100 Amps. When conducting $I_{DS}$ of 100 Amps current at 0.5 volts $V_{DS}$, the device dissipates about 50 watts and the junction temperature is close to the 125° C. typical maximum allowed operating temperature. The power device was supplying an inductive load. The inductive load was then shorted producing a short circuit current through the device limited only by the lead and power supply inductance and internal resistance. Peak currents of 300-700 Amps were measured flowing through the power MOSFET. The thin oxide PTSD diodes associated with the power MOSFET were used, through a feedback circuit, to shut off the power MOSFET in response to the temperature rise of the substrate resulting from the short circuit current. The feedback circuit was set to shut off the power device when the voltage current characteristics of the PTSD junction indicated that the PTSD junction had reached a pre-selected temperature in the range of 125°-175° C., typically 150° C. It was observed that the above-described thin oxide PTSD elements tracked the power device temperature so accurately and responded so quickly that the overloaded power device whose temperature rise they were sensing and which was conducting many times its rated current, could be automatically shut off before any damage occurred. Without the protection provided by the PTSD, the power device would otherwise rapidly reach a temperature that produced substantial damage to or complete failure of the device.

It will be apparent to those of skill in the art based on the description herein that the invented arrangement is compact, provides for PTSD units that are more closely thermally coupled to the substrate but still electrically isolated and which are of adjustable response using fusible links to vary the effective junction area. It is also apparent that the invented means and method provides these advantages in a manner which does not require substantial changes in the manufacturing operations used or the introduction of materials not already present for the manufacture on the same substrate of the power device. It is further apparent that the invented means and method incorporates over-voltage (e.g., ESD) protection for the thinner (gate) oxide used to improve the thermal coupling of the PTSD units to the substrate in a particularly compact and simple fashion, and with little or no additional chip area consumed. Further, the fusible link arrangement using the poly rather than the metal can be accomplished in a manner to provide maximum thermal isolation from the substrate at the same time that the thermal coupling the substrate for the PTSD devices is maximized. This is highly desirable.

While the invented means and method have been described for silicon semiconductor substrates and polysilicon semiconductor layers, it will be readily apparent to those of skill in the art based on the description herein that other semiconductor substrates could be used and other semiconductor layers could be used, either single crystal or polycrystalline. Accordingly, as used herein, it is intended that the words "poly" or "polysilicon", whether singular or plural, incorporate these other materials and material structures for the PTSD elements and Zeners and other diodes and that the words "substrate" or "silicon", whether singular or plural as referring to the substrate, incorporate other semiconductor materials well known in the art.

Accordingly, it is intended to include these and other variations as will occur to those of skill in the art based on the description herein in the claims that follow.

We claim:

1. A process for forming a semiconductor structure combining active devices with a substrate temperature sensing element, comprising:
   providing a semiconductor substrate;
   forming, on the substrate, a dielectric having a first region of a first thickness of about 0.1 microns or less and a second region of a second, larger thickness; and
   forming on the first region a semiconductor PN junction electrically isolated from but thermally coupled to the substrate through the first region.

2. The process of claim 1 further comprising forming an over-voltage protection device electrically coupled between the PN junction and the substrate.

3. The process of claim 1 further comprising forming another PN junction coupled across the PN junction and in opposition thereto.

4. The process of claim 3 wherein the step of forming the PN junction comprises oppositely doping adjacent portions of a polycrystalline semiconductor layer over the first region.

5. The process of claim 2 wherein the step of forming the over-voltage protection device comprises forming at least two back-to-back PN junctions in a polycrystalline semiconductor on the second region.

6. The process of claim 1 wherein the step of forming a PN junction comprises forming a PN junction that is substantially at right angles to the dielectric surface in the first region.

7. The process of claim 1 further comprising coupling the PN junction to a gate electrode of an active device.

8. A process for forming a semiconductor structure employing active insulated gate field effect devices separated by an inactive field region, comprising:
   providing a substrate having a semiconductor surface;
   providing a dielectric layer on the semiconductor surface, wherein the dielectric layer has a first region of a first thickness of about 0.1 micrometers or less and is suitable for a gate dielectric for the active field effect devices and a second region of a second, larger, thickness suitable for the field region;
   providing a semiconductor PN junction located on the first region and thermally coupled to the semiconductor surface therethrough; and
   providing over-voltage protection means coupled to one side of the semiconductor PN junction for preventing electrical breakdown of the first region.

9. The process of claim 8 further comprising providing a further rectifying junction coupled across the PN junction in opposition thereto.

10. The process of claim 9 wherein the step of providing a further rectifying junction comprises providing a PN junction device having a breakdown voltage less than a rupture voltage of the first region.

* * * * *